(12) United States Patent
Chan et al.

(10) Patent No.: US 7,541,058 B2
(45) Date of Patent: Jun. 2, 2009

(54) METHOD OF MAKING CIRCUITIZED SUBSTRATE WITH INTERNAL OPTICAL PATHWAY

(75) Inventors: Benson Chan, Vestal, NY (US); How T. Lin, Vestal, NY (US); Roy H. Magnuson, Endicott, NY (US); Voya R. Markovich, Endwell, NY (US); Mark D. Poliks, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 11/907,006

(22) Filed: Oct. 9, 2007

(65) Prior Publication Data

US 2009/0092353 A1  Apr. 9, 2009

(51) Int. Cl.
G02B 6/02 (2006.01)
H01L 21/00 (2006.01)
G03G 15/00 (2006.01)
G02B 6/12 (2006.01)

(52) U.S. Cl. .................. 427/163.2; 427/466; 427/468; 427/470; 427/162; 438/31; 430/56; 430/57.1; 430/60; 430/62; 385/14; 385/129; 385/130; 385/131; 385/141

(58) Field of Classification Search .................. 385/14, 385/15, 129, 130, 131, 132, 141, 143, 145, 385/52; 438/29, 31; 430/56, 57.1, 60, 66, 430/62; 427/465, 467, 466, 470, 485, 162, 427/163.2, 164, 468
See application file for complete search history.

(56) References Cited

U.S. PATENT DOCUMENTS

| | | | | |
|---|---|---|---|---|
| 4,582,390 A | * | 4/1986 | Furuya | 385/131 |
| 5,263,111 A | * | 11/1993 | Nurse et al. | 385/130 |
| 6,690,845 B1 | * | 2/2004 | Yoshimura et al. | 385/14 |
| 6,706,546 B2 | * | 3/2004 | Yoshimura et al. | 438/31 |
| 6,952,504 B2 | * | 10/2005 | Bi et al. | 385/9 |
| 6,996,305 B2 | | 2/2006 | Kim et al. | 385/15 |
| 7,045,897 B2 | | 5/2006 | Egitto et al. | 257/759 |
| 7,136,551 B2 | | 11/2006 | Cho et al. | 385/31 |
| 7,149,376 B2 | | 12/2006 | Uchida et al. | 385/15 |
| 7,149,389 B2 | | 12/2006 | Yoon et al. | 385/43 |
| 7,212,713 B2 | | 5/2007 | Fukuzawa et al. | 385/50 |
| 7,223,023 B2 | | 5/2007 | Killer et al. | 385/88 |
| 7,224,857 B2 | | 5/2007 | Liu et al. | 385/14 |
| 7,228,020 B2 | | 5/2007 | Weigert | 385/14 |
| 2006/0210213 A1 | | 9/2006 | Huang et al. | 385/14 |

FOREIGN PATENT DOCUMENTS

JP  2000-121859  4/2000  ............ 385/14 X

* cited by examiner

*Primary Examiner*—Brian M Healy
(74) *Attorney, Agent, or Firm*—Mark Levy; Lawrence R. Fraley; Hinman, Howard & Kattell

(57) ABSTRACT

A circuitized substrate (e.g., PCB) including an internal optical pathway as part thereof such that the substrate is capable of transmitting and/or receiving both electrical and optical signals. The substrate includes an angular reflector on one of the cladding layers such that optical signals passing through the optical core will impinge on the angled reflecting surfaces of the angular reflector and be reflected up through an opening (including one with optically transparent material therein), e.g., to a second circuitized substrate also having at least one internal optical pathway as part thereof, to thus interconnect the two substrates optically. A method of making the substrate is also provided.

18 Claims, 3 Drawing Sheets

METHOD OF MAKING CIRCUITIZED SUBSTRATE WITH INTERNAL OPTICAL PATHWAY

TECHNICAL FIELD

This invention relates to circuitized substrates (e.g., printed circuit boards and chip carriers) and particularly to circuitized substrates having means to provide optical transmissions as part thereof.

CROSS REFERENCE TO CO-PENDING APPLICATION

In Ser. No. 11/907,004, entitled "Method of Making Circuitized Substrate With Internal Optical Pathway Using Photolithography", filed concurrently herewith, there is defined a method of making a circuitized substrate (e.g., PCB) including at least one and possibly several internal optical pathways as part thereof such that the resulting substrate will be capable of transmitting and/or receiving both electrical and optical signals. The method involves forming at least one opening between a side of the optical core and an adjacent upstanding member such that the opening is defined by at least one angular sidewall. Light passing through the optical core material (or into the core from above) is reflected off this angular sidewall. The medium (e.g., air) within the opening thus also serves as a reflecting medium due to its own reflective index in comparison to that of the adjacent optical core material. The method utiilizes many processes used in conventional PCB manufacturing, thereby keeping costs to a minimum. The formed substrate is capable of being both optically and electrically coupled to one or more other substrates possessing similar capabilities, thereby forming an electro-optical assembly of such substrates.

BACKGROUND OF THE INVENTION

In response to increases in data transmission and data processing rates brought about by broadband communications and interactive telecommunication and computer services, there is a need for increased interconnection density and capacity in electronic equipment, and particularly in circuitized substrates which form part of such equipment. This need has led to a growing reliance upon optical means such as optical fibers as a replacement for traditional wire (e.g., copper) transmission lines. In some situations involving long distance transmissions, such a demand has resulted in the almost complete replacement of copper wire with optical fiber. The advantages of doing so include lower transmission losses and superior bandwidth characteristics. Optical transmission can also improve system performance if applied at short distances, for example, such as between physically adjacent equipment racks and cabinets, or between offices in a given building. However, the benefits of optical fiber transmission extend to even shorter distances, as at intra-board level among integrated circuits and other components on a single circuitized substrate (e.g., circuit board). This also applies at the intra-module level for interconnecting such components as very large scale (VLSI) and ultra large scale (ULSI) integrated circuits and chip subassemblies in a single electronic module. Use of such optical connections is also considered advantageous because such close (and more distant) transmissions are able to do so at gigabyte speeds.

Still further advantages of optical interconnections over electrical conductors at the substrate and module level include immunity to electromagnetic interference (EMI) or electrical noise, electrical isolation of interconnected components, far less frequency dependent signal degradation, and higher possible density of necessary interconnects due to lack of cross-talk between closely spaced, fine conductors.

Two examples of present efforts to provide optical interconnections at the circuitized substrate level are illustrated in the optical flex technology such as that marketed by Advanced Interconnection Technology, LLC of Islip, N.Y. and the optical flex foil approach which is part of the Apollo Demonstrator project at the Micro Interconnect Research Center of L M Ericsson, Stockholm, Sweden (described in Ericsson review, No. 2, 1995, vol. 72). In general, these optical interconnections involve arranging lengths of optical fibers in a desired pattern customized to the intended application, laminating the optical fibers between sheets of a flexible foil and applying appropriate connectors and terminations to the fiber ends. The lamination holds both the fibers and the connectors in the desired layout. The flex foil is then assembled to a conventional rigid circuit board simply by plugging the connectors to corresponding mating connectors on the circuit board. Mechanical supports may be provided on the circuit board for stabilizing the flex foil in place rather than relying on the fiber connectors alone for this purpose. The flex foil is typically supported in spaced relationship above the electrical components on the board. It has also been suggested that the flex foil be laminated or bonded to a rigid circuit board to thereby integrate optical and electrical interconnects.

It is understood that the above two examples and those represented in the patents listed below are not an exhaustive summary of those possibly available in the field. Further, the citation of these documents is not an admission that any is prior art to the present invention.

In U.S. Pat. No. 6,996,305, there is described a printed circuit board (hereinafter also referred to simply as a PCB) with opto-via holes for transmitting an optical signal to an optical waveguide in the PCB, and a process of forming the opto-via holes. The process comprises forming a plurality of via holes on a plurality of copper-clad laminates using a drill, plating an inner wall of each via hole, exposing and etching the plated portions of an upper and lower side of each copper clad laminate to form a circuit pattern on the upper and lower side of the copper clad laminate, layering the patterned copper clad laminates on each other using an insulating resin adhesive, and removing the insulating resin adhesive in the predetermined via holes to form opto-via holes. According to the authors, the process is advantageous because the optical signal is stably transmitted to the optical waveguide in the PCB without damaging the optical waveguide directly exposed to an external environment, and the optical waveguide suitable to physical properties of the material constituting the PCB is easily inserted between the inner layer and the outer layer.

In U.S. Pat. No. 7,045,897, there is described an electrical assembly which includes a circuitized substrate comprised of an organic dielectric material having a first electrically conductive pattern thereon. At least part of the dielectric layer and pattern form the first, base portion of an organic memory device, the remaining portion being a second, polymer layer formed over the part of the pattern and a second conductive circuit formed on the polymer layer. A second dielectric layer if formed over the second conductive circuit and first circuit pattern to enclose the organic memory device. The device is electrically coupled to a first electrical component through the second dielectric layer and this first electrical component is electrically coupled to a second electrical component. A method of making the electrical assembly is also provided, as is an information handling system adapted for using one or more such electrical assemblies as part thereof. U.S. Pat. No. 7,045,897 is assigned to the same Assignee as the present invention.

In U.S. Pat. No. 7,136,551, there is described an optical printed circuit board (PCB) having a multi-channel optical waveguide, which comprises an optical waveguide having an optical path for transmitting light beams, a groove for penetrating the optical waveguide and an optical interconnection block inserted in the groove and connected to the optical waveguide to transmit the light beams, wherein the optical interconnection block includes an optical fiber bundle bent by the angle of 90 degrees. The optical interconnection block connects a plurality of multi-layered optical waveguides to transmit light beams to the optical waveguides. The optical fiber bundle is installed as a medium of the multi-channel optical waveguide in the optical PCB.

In U.S. Pat. No. 7,149,376, there is described a circuit board with embedded optical fibers terminating in fiber ends which face into holes defined in the circuit board and optoelectronic emitter or detector modules mounted in the holes in optical coupling with the fiber ends. Each module is electrically connected to circuit traces on the circuit board and is optically coupled to one or more optical fibers terminating on a side surface of the hole. The modules have an optical axis oriented into the hole and a reflector supported in the hole for optically coupling the photo emitter/detector module with the fiber ends on the side surface of the hole.

In U.S. Pat. No. 7,149,389, there is described an optical printed circuit board system having a tapered optical waveguide. The system includes a substrate as a printed circuit board having an electrical circuit and on which an electrical circuit chip is mounted, a system board including an optical bench coupled to the substrate and on which a photoelectrical signal chip electrically connected to the electrical circuit chip through the electrical circuit, an optical device electrically connected to the photoelectrical signal chip, and a first optical waveguide aligned to the optical device for optical coupling. The waveguide is tapered to have a smaller aperture in an output node for outputting the optical signals smaller than that in an input node for inputting the optical signals. The system further includes a back plane including a groove into which the system board is inserted and a second optical waveguide optically coupled to the first optical waveguide and tapered to have a smaller aperture in the output node than in the input node. The input node of the first optical waveguide is optically coupled to the output node of the second optical waveguide or the output node of the first optical waveguide is optically coupled to the input node of the second optical waveguide.

In U.S. Pat. No. 7,212,713, there is described an optical transmission substrate including: a first substrate; an optical waveguide which has clad covering a core and a periphery of the core and extends on an upper surface of the first substrate; a second substrate provided parallel to the first substrate so that a lower surface thereof contacts an upper surface of the optical waveguide; a reflection surface which is provided on a cross section of the core at an end of the optical waveguide and reflects light, which travels through the core of the optical waveguide, toward the second substrate; and a light guide which is provided in the second substrate and guides the light, which is reflected toward the second substrate, toward an upper surface of the second substrate from a position closer to the core than an upper surface of the clad.

In U.S. Pat. No. 7,223,023, there are described optoelectronic transmission and/or reception arrangements having a surface-mounted optoelectronic component and a circuit board provided with electrical lines, the optoelectronic component being surface-mounted on the circuit board, the optical axis of the optoelectronic component running perpendicular to the plane of the circuit board. In one embodiment, provision is made of a holding apparatus for receiving and orienting an optical waveguide to be coupled to the optoelectronic component, which holding apparatus directly adjoins the side of the optoelectronic component that is remote from the circuit board. In another embodiment, the circuit board has a cutout and light is coupled into or out of the optoelectronic component in the direction of the cutout of the circuit board.

In U.S. Pat. No. 7,224,857, there is described an optical-routing board for an opto-electrical system having optical waveguides embedded in non-laminated optical substrates that enable optical signals to be routed among opto-electric components mounted on the top surfaces of the optical substrates. Methods for making the optical-routing boards are also disclosed. The waveguides are formed by focused pulse-laser writing, with the focal point of the pulsed-laser beam being moved in a three-dimensional manner through the non-laminated substrate. Bevel surfaces are preferably formed in the substrate to facilitate bending of the waveguides.

In U.S. Pat. No. 7,228,020, there is described an optoelectronic arrangement having a surface-mountable semiconductor module having at least one optoelectronic transmitting and/or receiving unit, a housing, in which the optoelectronic transmitting and/or receiving unit is arranged, and a mounting side of the housing, which, in the case of surface mounting of the semiconductor module on a printed circuit board, faces the printed circuit board. The arrangement furthermore has a cooling element, which is thermally coupled to the semiconductor module for the purpose of cooling the optoelectronic transmitting and/or receiving unit. The cooling element is arranged on a side of the housing that is remote from the mounting side.

In U.S. Publication 2006/0210213, there is described an optical backplane providing integrated optical couplers for coupling to external optical fibers, along with a method for making the same. One optical backplane has a first cladding layer disposed over the top surface of a substrate, and at least a first core body disposed over the first cladding layer, with the first core body having a first end and a second end. A material layer is disposed above the first cladding layer and the first end of the first core body, with the material layer having a top surface and a bottom surface. A focusing element is formed at the top surface of the material layer, with the focusing element being located above the first end of the first core body.

In Japanese Patent Application Publication No. 2000-121859, there is described a method of manufacturing an embedded type optical waveguide device. This method involves manufacturing an optical waveguide device by (1) depositing an "undercladding" layer over a silica glass substrate, (2) forming a mask over the undercladding layer, (3) using this mask to form a groove for accommodating a core, (4) depositing a core layer over the undercladding layer, (5) forming a core by leaving the core layer inside the groove and removing other portion of the core layer on the undercladding layer by chemical-mechanical polishing, and (6) forming an "overcladding" layer over the core and the undercladding layer.

In U.S. Pat. No. 6,690,845 issued to Yoshimura et al., there is disclosed three-dimensional opto-electronic modules having a plurality of opto-electronic (O/E) layers, with optical signals being routed between O/E layers within one or more three-dimensional volumes. The O/E layers are disposed over and above one another with at least one of their edges aligned to one another. At least two of the O/E layers have waveguides with ends near the aligned edges. A plurality of Z-connector arrays are disposed between the O/E layers and within the three-dimensional volumes to provide a plurality of Z-direction waveguides. A first vertical optical coupler couples light from one waveguide in one O/E layer to a Z-direction waveguide, and a second vertical optical coupler couples the light from the Z-direction waveguide to a second waveguide in a second O/E layer.

As defined herein, the present invention defines the formation of a circuitized substrate during which at least one (and possibly several) optical pathways are formed which are capable of having optical signals pass there-through and eventually exit the substrate, e.g., to be coupled to an external optoelectronic component such as a transmitter-receiver device. The method used to accomplish this formation utilizes many conventional processes used in producing printed circuit boards and is thus able to provide an effective and cost-reduced process compared to processes such as those described above. It is believed that such a method would constitute a significant advancement in the art.

OBJECTS AND SUMMARY OF THE INVENTION

It is, therefore, a primary object of the invention to enhance the circuitized substrate art and particularly that aspect of the art involving the use of internal optical pathways for such substrates.

It is another object of the invention to provide a new and unique method of making a circuitized substrate which enables utilization of some conventional printed circuit board processes to thus assure a relatively cost-effective method and resulting product.

It is yet another object of the invention to provide such a method which may be implemented to produce a wide range of circuitized substrate products, including of large and small sizes, thus making the final products usable in a wide variety of end products.

According to one aspect of this invention, there is provided a method of making a circuitized substrate including at least one optical pathway therein, the method comprising the steps of providing a first dielectric layer, providing a first electrically conductive layer on the first dielectric layer, providing a first cladding layer on the first electrically conductive layer, forming an angular reflector on the first cladding layer, providing an optical core on the first cladding layer relative to the angular reflector to provide an optical pathway for optical signals passing through this optical core, providing a second cladding layer over the optical core and angular reflector, providing at least one covering layer over the second cladding layer to form a circuitized substrate, and forming an opening within the covering layer and second cladding layer relative to the angular reflector such that optical signals passing through the optical core will be reflected off the angular reflector and pass through this opening.

According to another aspect of this invention, there is provided a circuitized substrate including at least one optical pathway therein, the circuitized substrate comprising a first dielectric layer, a first electrically conductive layer on the dielectric layer, a first cladding layer on the electrically conductive layer, an angular reflector on the cladding layer, the angular reflector including at least two reflecting angled surfaces, an optical core on the first cladding layer relative to the angular reflector, this optical core adapted for providing an optical pathway for optical signals to pass there-through, a second cladding layer over the optical core and angular reflector, at least one covering layer over this second cladding layer, and an opening within the covering and second cladding layers relative to the two reflecting surfaces such that optical signals passing through the optical core will be reflected off the reflecting surfaces and pass through this opening.

BEST MODE FOR CARRYING OUT THE INVENTION

Figure 1:
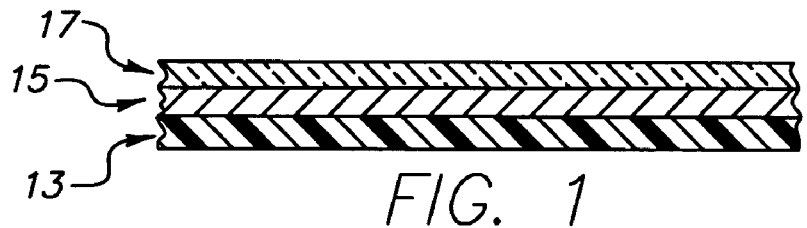
FIGS. 1-9 are side elevational views, in section and on an enlarged scale, illustrating the various steps in making a circuitized substrate according to one embodiment of the invention.

For a better understanding of the present invention, together with other and further objects, advantages and capabilities thereof, reference is made to the following disclosure and appended claims in connection with the above-described drawings. Like numerals will be used to identify like elements from Figure to Figure.

By the term "circuitized substrate" as used herein is meant to include multilayered structures having a plurality of dielectric layers and a plurality of electrically conductive layers, typically arranged in an alternating manner, capable of operating to conduct electrical signals there-through. The term "circuitized substrate" as used herein is also meant to include at least one internal optical pathway capable of having optical signals pass there-through. Examples of dielectric materials usable for the dielectric layers include fiberglass-reinforced epoxy resins (sometimes referred to as "FR4" dielectric material in the art), polytetrafluoroethylene (e.g., Teflon), polyimides, polyamides, cyanate resins, photo-imageable materials, and other like materials. The conductive layers for such substrates are metal and may function in various conductive capacities (e.g., as power, signal and/or ground planes) in the final product. Examples of metals for such layers include copper and copper alloys, but may include additional metals (e.g., nickel, aluminum, etc.) or alloys thereof. It is believed that the teachings of the instant invention are also applicable to what are known as "flex" circuits (which use dielectric materials such as polyimide), in addition to the more widely known and more rigid printed circuit boards and chip carriers as sold today.

By the term "optical pathway" or "core" as used herein is meant a defined path of optically transmissible material, including a path of rectangular, circular, or other cross-sectional configuration, which is capable of having optical data-carrying signals pass there-through. One example of such a material is pure silica glass, and others are known in the art. The optical signals passing through this material may be provided from a conventional source such as an optoelectronic transmitter/receiver module (e.g., one having a laser as a light source) or the like, many of which are known in the art. Such a pathway is thus capable of providing an optical connection between two such components such that these components may communicate, optically, between each other. Various known optically transparent waveguide polymer materials, as well as silica glass, are capable of being used for this "core", provided the resulting layer as formed has a refractive index greater than that of the surrounding cladding layers defined below.

By the term "cladding layer" as used herein is meant a layer of material capable of being successfully bonded (clad) to an optical core and which includes a refractive index less than that of the core. Such materials are known in the art. One example is silicon oxide base material with a dopant added to increase the refractive index. Examples of known dopants include fluorine and boron, with the doping possibly occurring using what is known as a plasma CVD process. Other doping processes are also known in the art. Various known optically transparent waveguide polymer materials are also usable for this layer.

FIGS. 1-9 illustrate the steps of making a circuitized substrate (FIG. 9) according to one embodiment of this invention. The views shown are in cross-section, on an enlarged scale and are only partially presented. Therefore, it is understood that the structures shown may have much wider dimensions than shown, relatively speaking, and may include additional features (e.g., signal pads and/or lines, conductive thru-holes, etc.). The circuitized substrate made using this method is shown to include only one angular reflector with opposing optical pathways adjacent thereto, but it is understood that several additional such reflectors and pathways may be produced using the unique teachings herein. The invention is thus not limited to formation of a circuitized substrate with only one reflector and two adjacent pathways.

In FIG. 1, a first dielectric layer 13 (e.g., of the aforementioned "FR4" material) is provided and includes a thickness of from about one mil (a mil understood to be 1/1000 of an inch) to thirty mils (0.030 inch). On layer 13 is formed a first electrically conductive layer 15, preferably of copper or copper alloy. Layer 15 may be provided in sheet form and bonded to layer 13 using conventional PCB lamination processing. Such lamination typically involves the alignment of desired layers (usually in alternating fashion, e.g., dielectric-conductive-dielectric, etc.) and the application of significant pressure onto this stack at elevated temperatures for a predetermined time period. Such processing, as stated, is conventionally known and further description is not considered necessary. In one embodiment, layer 15 may have a thickness of from about 0.7 mils to as much as about five mils. Conductive layer 15 may be circuitized (e.g., provided with a plurality of signal lines and/or pads oriented in a pre-established pattern). If done, this will preferably be accomplished using conventional photolithographic processing known in the PCB art for providing circuits in conductive (e.g., copper) sheets. Such circuitizing preferably occurs with layer 15 in place on the underlying support layer 13.

Atop layer 15 is provided a first cladding layer 17, which is preferably provided on layer 15 also using lamination, in this particular example, a pressure of from about 300 pounds per square inch (PSI) to about 500 PSI, at a temperature of from about 170 degrees Celsius (C) to about 210 degrees C., for a time period of about 90 to about 120 minutes. It is possible using the teachings herein to laminate all three layers 13, 15 and 17, simultaneously, or, alternatively, laminate layers 12 and 15, and then laminate layer 17 onto this sub-composite structure. Cladding layer 17 may be of one of the materials listed above (including having a dopant therein), or may be comprised of various known "optically" transparent optical waveguide polymer materials. In one embodiment, layer 17 may possess a refractive index (which is understood to mean the ratio of the speed of light in vacuum, air or other medium of reference, compared to the speed of light in a given medium) of about 1.40.

Figure 2:
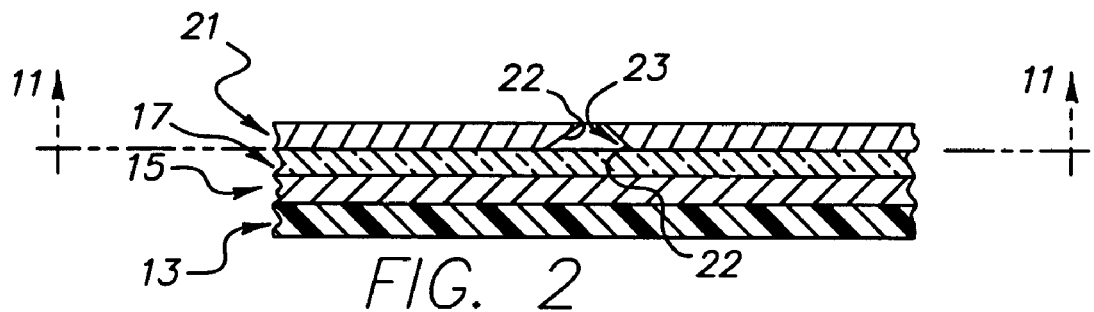
Figure 11:
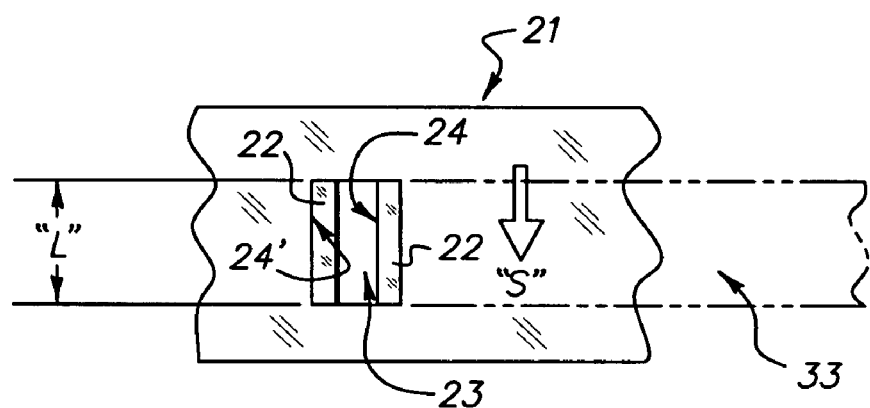
FIG. 11 is a bottom view of one embodiment of a stencil which may be used in the invention, as taken along the line 11-11 in FIG. 2.

In FIG. 2, a stencil 21 including a tapered opening 23 therein is shown as having been aligned over the FIG. 1 structure and then positioned on the upper surface of layer 17. As discussed, more than one opening may be used and the invention is not limited to only one. Stencil 21 may be of metal (e.g., copper) similar to that used in conventional PCB conductive layers with opening 23 formed therein using known photolithographic processing also known in the PCB art for forming circuit patterns and openings within such copper layers. Added definition is not deemed necessary. Stencil 21 may also be of stainless steel material. In one embodiment, stencil 21 has a thickness of about five to about ten mils while tapered opening 23 may possess an upper (smaller) opening diameter of thirty mils and a lower (greater) opening diameter of forty-five mils. A more positive placement may be attained using a vacuum to draw stencil 21 firmly onto the layer's upper surface. The angled internal walls 22 of opening 23 are at forty-five degrees relative to the upper and lower surfaces of the stencil and thus relative to the upper surface of layer 17. One example of a tapered opening 23 usable in this invention is shown in FIG. 11, taken along the line 11-11 in FIG. 2. Opening thus includes substantially rectangular upper and lower openings 24 and 24', respectively. In this example, the longitudinal sidewalls 22 may each be eight mils in length.

Figure 3:
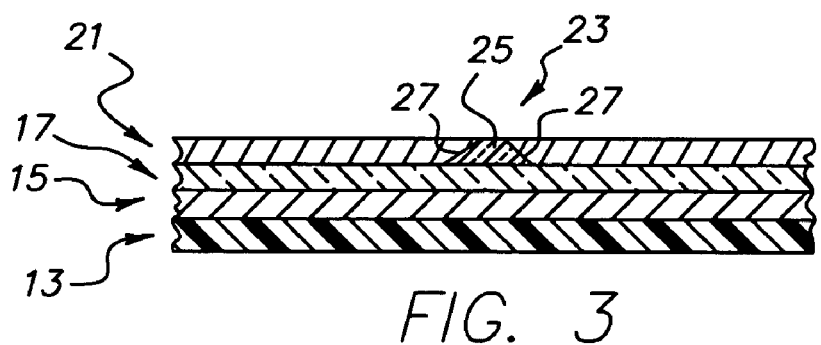

In FIG. 3, a quantity of material 25 is deposited within opening 23, preferably using a screening procedure. During this procedure, a quantity of material, in paste-like form, is pressed through opening 23 as a blade passes over the stencil's upper surface, in effect squeezing the material through the opening to substantially fill the opening. The preferred direction for screening the material into opening 23 is shown in FIG. 11 (directional arrow "S"). This represents the direction in which the screen blade (not shown) moves while deposition occurs. One example of the material 25 may be the same as for cladding layer 17. Other acceptable materials include UV-curable silver epoxy and other epoxy based materials. The material 25, as stated, is in paste-like form when deposited, and is then hardened such as by placing the FIG. 3 structure within a convection oven, or by "flash curing" the material. During such flash curing, a high energy Xenon flash lamp may be used to cure the materials. Such hardening occurs following removal of stencil 25, which may be accomplished by a simple manual removal (stripping away) procedure. Other removal means, including use of a vacuum chuck or the like (not shown) may also be used. Material 25, as hardened, thus includes side walls 27 which, understandably, are each of forty-five degrees relative to the upper surface 17 of layer 17 and of the same dimensions as opposing internal walls 22 of opening 23. The hardened structure of material 25 shown in FIG. 3 is understood to serve as the "base" for the invention's angular reflector.

Figure 4:
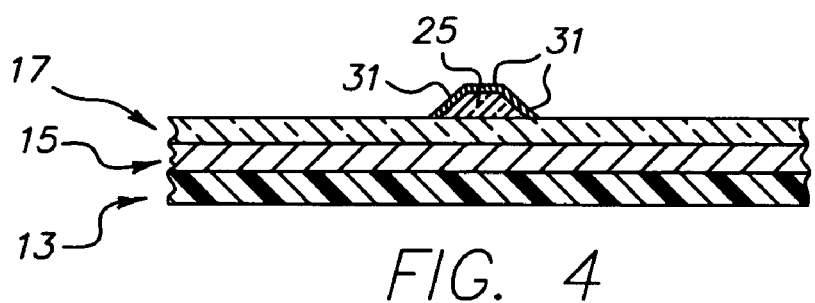

The next step of the invention, as shown in FIG. 4, involves the deposition of a reflective layer 31 onto material member 25. As seen, layer 31 covers the sides and top of member 25, but it is only essential that it cover the angular side walls (27 in FIG. 2). Various methods may be used to depositing layer 31, depending on the material used. In one embodiment, layer 31 is metal, preferably copper or aluminum, and possesses a thickness from only about 0.05 to about 0.1 mil. One method of providing the metal is to use electro-less plating, similarly, again, to electro-less plating often used in the PCB manufacturing art. In addition to electro-less plating, it is also possible to use electrolytic plating, another process occasionally used in the PCB area. Other suitable metal deposition methods that may be used to apply layers 31 include thermal spray coating, vapor deposition, and chemical vapor deposition.

Figure 5:
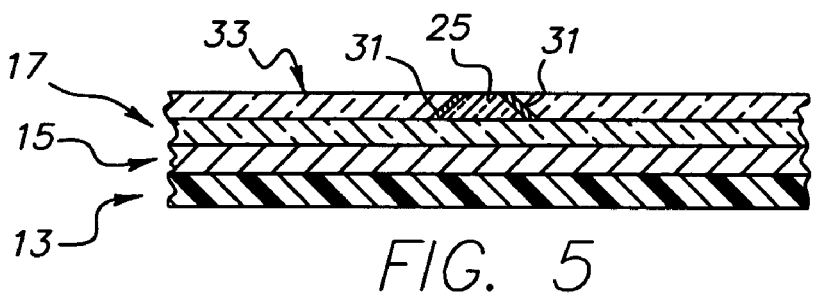

With reflective layer 31 in position, the next step is to deposit an optical core layer 33, as shown in FIG. 5. Optical core 33 is of a highly conductive (optically) material such as one of those defined above (e.g., silica glass), and, in one embodiment, possesses a refractive index of 1.42, higher than that of the underlying cladding layer 17. Understandably, the material of layer 33 is different, at least optically, than that of layer 17. By way of example, the cladding layer may include one of the aforementioned dopants while the optical core will not. It is also to be understood that the cladding layer and the optical core may have a width dimension less than that of the corresponding supporting layers 13 and 15. For example, layer 17 and optical core 33 may possess a width approximately the same as the length (longest dimension) of the respective side walls 27 of member 25. This dimension is shown by the letter "L" in FIG. 11. At such a width, layer 31 would appear as shown in phantom in FIG. 11 on the one side of the member 25 (now shown in FIG. 11), member 25 understood to fully occupy the opening 23 of stencil and retaining this shape upon stencil removal as occurred in FIG. 4. It is also understood that in the embodiment defined herein, the optical core layer 33 will be located adjacent (and contiguous) both opposite side walls 27. That portion of layer 33 on the left in FIG. 11 is omitted for ease of illustration but understood from FIG. 5. Optical core layer 33 is applied using a standard coating process in which a uniform layer of optical polymer material is deposited onto the surface of the cladding layer. Some examples of suitable coating processes for this material include spin coating, slot coating, inkjet material deposition and use of a doctor blade. Optical core layer 33 may have a resulting thickness of from about two mils to about 2.5 mils.

Figure 6:
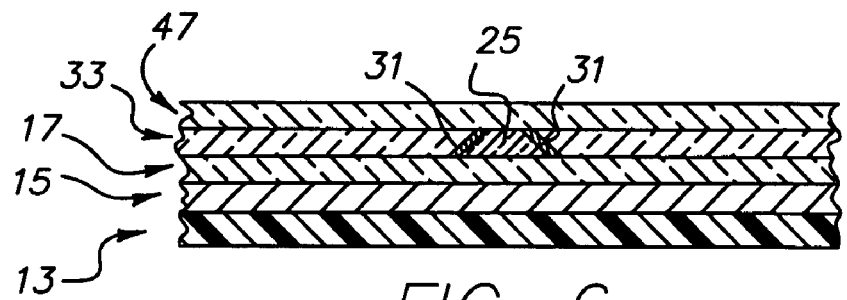

In FIG. 6, a second cladding layer 47 is applied onto optical core layer 33, preferably using the same lamination process used for depositing the first cladding layer 17. Layer 47 is also preferably the same material as layer 17, and possesses the same refractive index (e.g., 1.40). Because it is essential that optical core layer 33 be completely surrounded by cladding material, layer 47 is applied at a width greater than the corresponding width of the underlying core 33, such that it will surround the top and both sides thereof. That is, because core layer 33 is preferably of substantially rectangular cross-section (similar to that of the side walls 27 of member 25), cladding layer is bonded to the upper planar surface of the core and also to both opposing upstanding sides. Understandably, the remaining underside of the core is bonded to the underlying cladding layer 17. The present invention thus assures that the core will be effectively surrounded with cladding material, again using lamination as used in the PCB industry. This represents another significant feature of this invention.

Figure 7:
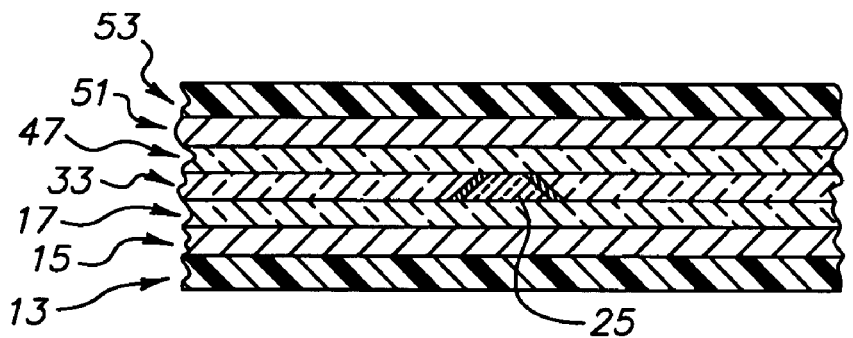

FIG. 7 is provided to show that additional layers (which may be referred to simply as covering layers), may be added atop layer 47, especially if same are needed to provide a final multilayered circuitized product having greater capabilities than the one shown in FIG. 6. These layers, shown by numerals 51 and 53, may be conductive and dielectric layers, respectively, and of similar material as layers 15 and 13, respectively. Layer 51, being conductive, may also be circuitized such as by using photolithographic processing defined above. More than two layers may also be provided, again depending on the operational electrical requirements for the final product. In one embodiment, it may be possible to add as many as twenty or more additional conductive and dielectric layers. Layers 51 and 53 may also be of similar thicknesses as layers 51 and 13, respectively, or of other acceptable thicknesses if desired. It is also within the scope of this invention to add at least one additional covering layer and not of a material such as those defined above. Such a layer, or layers if more than one is desired) will function to cover and thus protect the underlying optical pathway structure (cladding-core-cladding) which forms part of the final circuitized substrate.

Figure 8:
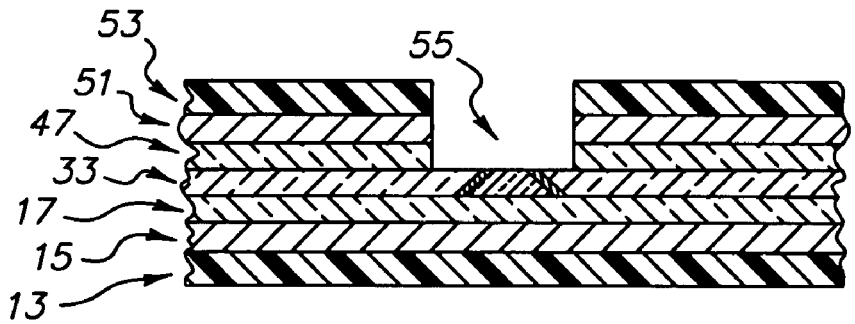
Figure 9:
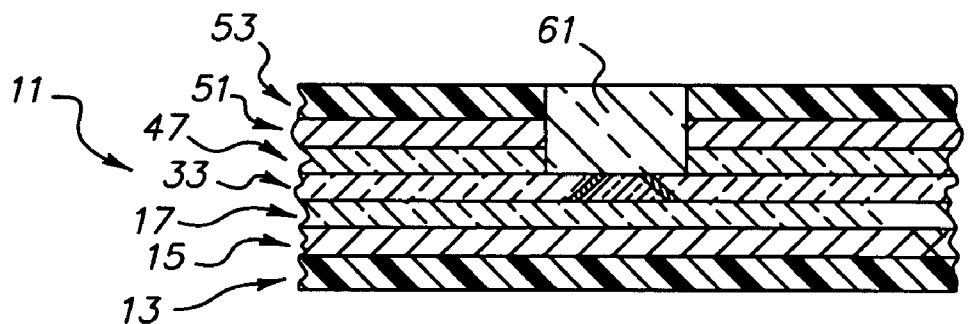
Figure 10:
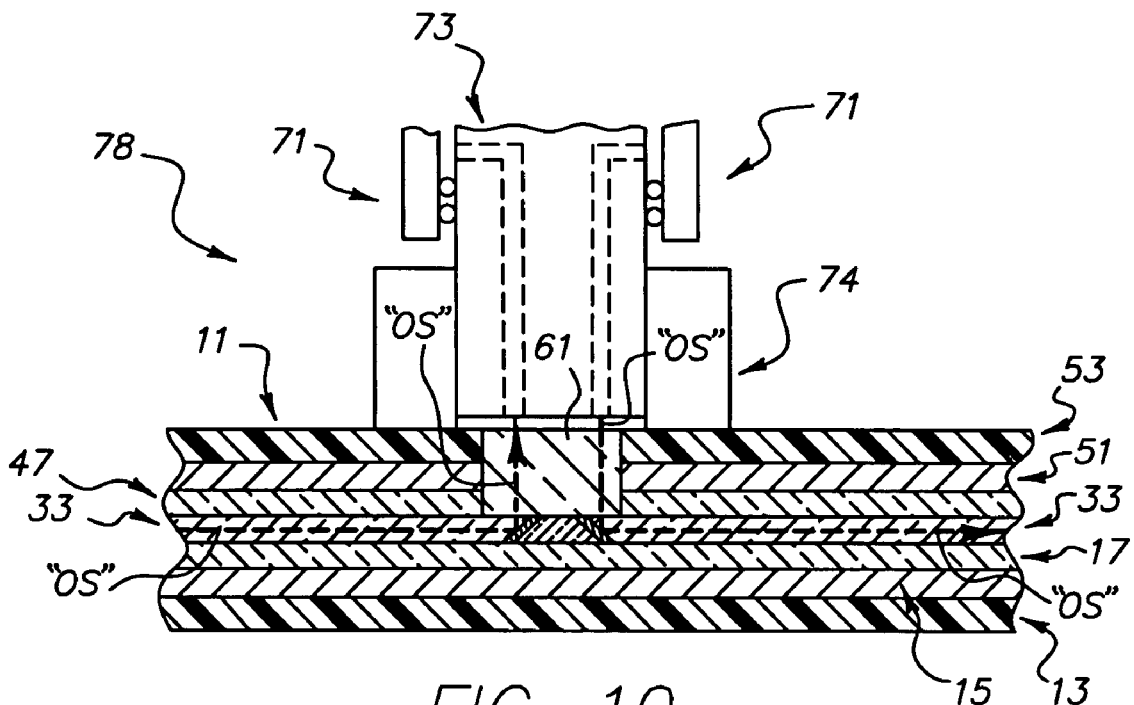
FIG. 10 is a side elevational view, also in section, illustrating an optical assembly capable of utilizing at least one of the circuitized substrates of the present invention.

In FIG. 8, an opening 55 is formed with the covering layers 51 and 53, preferably using a laser. Various lasers may be used, one example being a carbon dioxide laser. As shown, the laser effectively ablates both the dielectric material and the underlying conductive material. In one embodiment, opening 55 is substantially rectangular in side dimensions (shown) and also when viewed from above layer 53. That is, opening 55 possesses substantially similar length and width dimensions as the lower opening 24' of opening 23 in stencil 21, so as to effectively "cover" the correspondingly similar maximum length and width dimensions of the angular reflector 25. In one embodiment, opening 55 may possess length and width dimensions of about thirty and fifty mils, respectively. Upon removal of all conductive and dielectric material, opening 55 is then filled with optically transmissible (transparent) material 61, shown in FIG. 9. Such material may be the same as that for the optical core layer 33. In one example, this material may be optical polymer and may be applied using a conventional inkjet material deposition system The structure of FIG. 9, referable to as a circuitized substrate 11 now having at least one optical pathway internally thereof (two opposing such pathways, oriented in an opposing orientation, have been shown), is now ready for operation when coupled to appropriate other components. One example of such added components may be a pair of optoelectronic modules mounted on a second circuitized substrate 73 such as shown in FIG. 10, to produce an electro-optical assembly 78. Substrate 73 may be a "daughter card" while substrate 11 may represent a "motherboard" adapted for having such cards and other components positioned thereon and coupled thereto. If so, both substrates may be electrically coupled such as by using an electrical connector 74 mounted on substrate 11 and having the upper substrate positioned therein. Such electrical connectors typically include a plurality of contacts therein designed to mate with corresponding conductive pathways on the substrate's outer surface, these contacts in turn coupled to various internal conductors such as pins which project from the connector's body (housing) and fit within corresponding receiving openings within the hosting substrate. Such means of electrically coupling two substrates are very well known in the art and further description is not considered necessary. Accordingly, the aforementioned contacts, pins and receiving openings are not shown in FIG. 10.

In the case of substrates 11 and 73, these are also coupled in an optical manner, with optical data signals ("OS") passing through the optical core of the lower substrate 11 and reflecting off the substrate's angular reflector 25 as shown. Such data signals may pass from substrate 11 to substrate 73 or, as shown, pass into the upper substrate and outwardly therefrom. Other combinations are of course readily possible. If modules 71 are used, each may include a light-emitting diode or laser for emitting processed electrical signals within the substrate 73 which couple to the modules. Typically, a complete optoelectronic device of this type includes a die (semiconductor) which comprises an emitter, a header for providing mechanical support to the emitter, a lens for focusing light output generated by the LED or laser, and suitable electrical connections. It may function as a transmitter of optical data signals and/or receiver of same. If the latter, it will include a serializer for serializing received date, as well as means for converting such optical signals to electrical such that the resulting electrical signals may then pass to other sections of the hosting substrate and then perhaps to other equipment to which the substrate is operationally connected. Such optoelectronic devices, and the means of connecting same, are known in the art and further definition is not considered necessary. As seen in FIG. 10, one such module 71 (to the left) is adapted for receiving optical data signals wile the other provides optical signals down to the substrate 73 and then to the hosting substrate 11. Other such modules (not shown) may be used to transmit optical signals to and receive such signals from substrate 11. Understandably, the invention is not limited to using only these types of transmitters and receivers as others are possible.

Thus there has been shown and described a method of making a circuitized substrate having at least one (and possibly several) optical pathways therein such that the substrate may be coupled both electrically and optically in a facile manner to other substrates. The substrate as defined herein may be made using many conventional PCB processes, thereby assuring that the costs of producing the final product are kept to a minimum. Other advantages of the invention have been cited above or are discernible from the teachings herein.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a circuitized substrate including at least one optical pathway therein, said method comprising:
    providing a dielectric layer;
    forming an electrically conductive layer on said dielectric layer;
    laminating a cladding layer to said electrically conductive layer, having a predetermined refractive index, atop said electrically conductive layer, said cladding layer having an upper surface and a lower surface;
    aligning a stencil comprising a tapered opening therein over said cladding layer;
    depositing material within said tapered opening and pressing said material therethrough, squeezing said material to substantially fill said opening;
    removing said stencil;
    depositing a reflective layer having an angular configuration onto said material, covering the sides and top of said material; and
    depositing an optical core layer comprising highly optically conductive material onto said reflective layer such that optical signals passing through said optical core will be reflected off said angular reflector and pass through said opening.

2. The method of claim 1 further including circuitizing said electrically conductive layer.

3. The method of claim 1 wherein said circuitizing of said electrically conductive layer results in the formation of a plurality of electrical signal conductors.

4. The method of claim 3 wherein said circuitizing of said electrically conductive layer is accomplished using photolithographic processing.

5. The method of claim 1 wherein said forming of said reflective surface on said angular reflector is accomplished by forming a metal coating on said angular reflector.

6. The method of claim 5 wherein said forming of said metal coating on said angular reflector is accomplished using at least one of the techniques: electro-less plating, electrolytic plating, thermal spray coating, vapor deposition, and chemical vapor deposition.

7. The method of claim 1 wherein said depositing said optical core on said cladding layer relative to said angular reflector is accomplished by spin coating the material which comprises said optical core.

8. The method of claim 1 further including positioning a quantity of optically-transmitting material within said opening.

9. The method of claim 1 wherein said providing a cladding layer step comprises using lamination therefor.

10. The method of claim 1 wherein said cladding layer comprises optically transparent optical waveguide polymer material.

11. The method of claim 1 wherein said stencil comprises metal.

12. The method of claim 1 wherein said material comprises at least one of: optically transparent optical waveguide polymer material, UV-curable silver epoxy, and other epoxy based materials.

13. A method of forming a circuitized substrate, the steps comprising:
    a) providing a dielectric layer;
    b) bonding an electrically conductive layer to said dielectric layer;
    c) laminating a cladding layer to said electrically conductive layer, having a predetermined refractive index, atop said electrically conductive layer, said cladding layer having an upper surface and a lower surface;
    d) aligning a stencil on the upper surface of said cladding layer, said stencil having a predetermined thickness, an upper surface and a lower surface, and a tapered aperture formed therein, said tapered aperture having angled internal walls oriented at approximately 450° relative to said upper and lower surfaces of said stencil, the lowermost, outwardly tapered surface of said tapered aperture abutting the upper surface of said cladding layer;
    e) squeezing a paste-like material into and filling said tapered aperture;
    f) removing said stencil;
    g) hardening said paste-like material by flash curing, forming a base for an angular reflector;
    h) depositing a reflective layer onto said hardened paste-like material; and
    i) depositing an optical core layer having a refractive index greater than the predetermined refractive index of said cladding layer, said optical core layer providing an optical pathway for optical signals passing through said optical core.

14. The method of forming a circuitized substrate in accordance with claim 13, wherein said electrically conductive layer comprises a plurality of signal lines and pads oriented in a pre-established pattern.

15. The method of forming a circuitized substrate in accordance with claim 13, wherein said cladding layer comprises at least one optically transparent optical waveguide polymer material.

16. The method of forming a circuitized substrate in accordance with claim 15, wherein the refractive index of said cladding layer is approximately 1.40 and said refractive index of said optical core layer is approximately 1.42.

17. The method of forming a circuitized substrate in accordance with claim 16, wherein said stencil comprises metal.

18. The method of forming a circuitized substrate in accordance with claim 13, wherein said paste-like material filling said tapered aperture comprises at least one of cladding layer material and UV-curable silver epoxy, and epoxy-based material.

* * * * *